US007437131B2

(12) United States Patent
Wu et al.

(10) Patent No.: US 7,437,131 B2
(45) Date of Patent: Oct. 14, 2008

(54) ACTIVE MIXER WITH SELF-ADAPTIVE BIAS FEEDBACK

(75) Inventors: Ching-Kuo Wu, Taipei (TW); Chih-Wei Chen, Taipei (TW); Yun-Shan Chang, Taipei (TW); Shyh-Chyi Wong, Taipei (TW)

(73) Assignee: Richwave Technology Corp., Taipei (TW)

( * ) Notice: Subject to any disclaimer, the term of this patent is extended or adjusted under 35 U.S.C. 154(b) by 492 days.

(21) Appl. No.: 11/267,503

(22) Filed: Nov. 7, 2005

(65) Prior Publication Data

US 2006/0135106 A1    Jun. 22, 2006

(30) Foreign Application Priority Data

Dec. 21, 2004   (TW) ............................... 93139917 A

(51) Int. Cl.
*H04B 1/04*        (2006.01)

(52) U.S. Cl. ..................... 455/127.1; 455/230; 455/333
(58) Field of Classification Search .............. 455/127.1, 455/127.2, 130, 147, 230, 255, 290, 333, 455/334

See application file for complete search history.

*Primary Examiner*—Tony T Nguyen
(74) *Attorney, Agent, or Firm*—Troxell Law Office, PLLC

(57) ABSTRACT

An active mixer with self-adaptive bias feedback is described and resolves a poor linearity, inconvenient design of a bias circuit, and other defects of a conventional mixer. The dual self-feedback bias structure according to this invention is used. The active mixer with self-adaptive bias feedback has a power supply, an RF input match/drive unit, a local oscillator input match/drive unit, a mixer core unit, a self-adaptive twin bias circuit and an IF output match/buffer unit. This invention improves the linearity of a conventional mixer and does not affect other characteristics. There are fewer components in this invention; an area of the mixer is thus smaller. Further, this invention may improve temperature response, increase yield factor, and lower unit cost. The dual self-feedback bias structure is designed for further application to other semiconductor manufacturing processes, components, and microwave products.

17 Claims, 6 Drawing Sheets

ACTIVE MIXER WITH SELF-ADAPTIVE BIAS FEEDBACK

BACKGROUND OF THE INVENTION

1. Field of the Invention

This invention provides an active mixer with self-adaptive bias feedback and particularly to a design and concept of a dual self-feedback bias structure.

2. Description of Related Art

In various communication systems, a mixer is an essential element. The quality and performance of communication system depends greatly on the mixer's linearity, conversion gain, signal-to-noise rate, and temperature response as characteristics. Generally speaking, a bias may be provided in the mixer, and when an input signal is increased in a conventional bias circuit, the linearity of the mixer becomes quite poor. Thus, it is improved to be a single feedback bias circuit for slight increase of the linearity of mixer, but the increased linearity cannot yet meet requirements.

Recently, many methods for improving the linearity of mixer have been disclosed, as described in U.S. Pat. No. 6,205,325 (FIG. 1), U.S. Pat. No. 6,472,925 (FIG. 2), U.S. Pat. No. 6,639,446, and U.S. Pat. No.6,639,447.

However, a plurality of (digital) control circuit structures are included in the methods in which some structures require many bias power units; although the linearity of mixer is increased, the conversion gain is decreased and the signal-to-noise rate is increased. The original characteristics of mixer may even be destroyed or current consumption increased so that the overall performance of communication system is tremendously affected.

SUMMARY OF THE INVENTION

This invention is provided to solve the poor linearity of the conventional mixer, the defects of the bias circuit of the conventional mixer, and the inconvenience in design of the bias circuit of the conventional mixer. This invention thus provides an active mixer with self-adaptive bias feedback, in which the dual self-feedback bias structure is used. The active mixer with self-adaptive bias feedback comprises a power supply, an RF input match/drive unit, a local oscillator input match/drive unit, a mixer core unit, a self-adaptive twin bias circuit and an IF output match/buffer unit. Further, the power supply supplies voltage required by the RF input match/drive unit, the local oscillator input match/drive unit, the mixer core unit, the self-adaptive twin bias circuit unit and the IF output match/buffer unit.

The RF input match/drive unit receives an RF input signal, the local oscillator input match/drive unit receives a local oscillator input signal, and the mixer core unit receives a signal output from the RF input match/drive unit and the local oscillator input match/drive unit for execution of a signal mixing operation. The self-adaptive twin bias circuit unit outputs to the mixer core unit a constant bias for compensation. As a result, the IF output match/buffer unit receives a signal from the mixer core unit and outputs an IF signal after carrying out the signal match/buffering. The active mixer with self-adaptive bias feedback may further have a bandgap reference circuit; the voltage supply offers voltage to the bandgap reference circuit, and the bandgap reference circuit further outputs a constant voltage or current to the self-adaptive twin bias circuit unit.

The self-adaptive twin bias circuit unit is made of two linear bias circuits connected in parallel. The linear bias circuit may be formed with a plurality of transistors or passive components.

The active mixer with self-adaptive bias feedback according to this invention improves the linearity of a conventional mixer and does not affect other characteristics thereof. There are fewer components in this invention; an area of the mixer is thereby smaller. Additionally, this invention may improves temperature response, increases the yield factor, and lowers unit cost. The dual self-feedback bias structure is designed for further application to other semiconductor manufacturing processes, components, and microwave products.

Further explanation of the features and technical means of this invention is given with reference to the detailed description according to this invention accompanied with drawings; however, the accompanied drawings are provided for reference and illustration only and are not limited to this invention.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
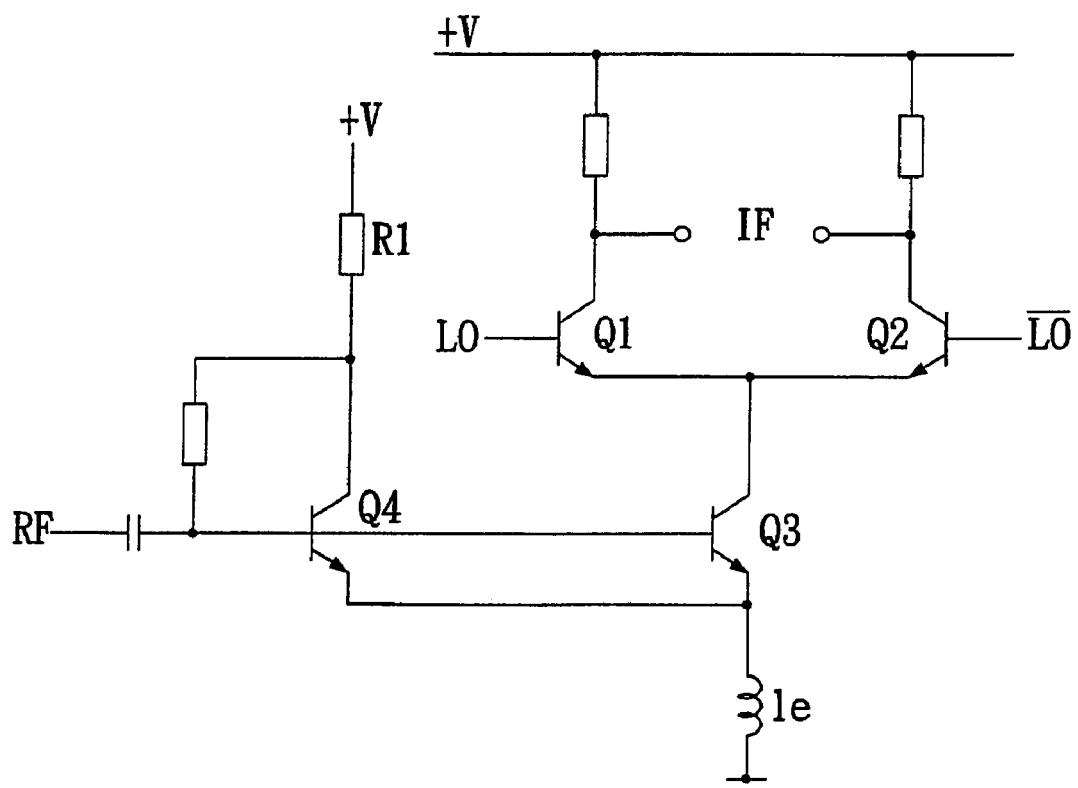
FIG. 1 is a schematic view illustrating a circuit of a negative feedback linear mixer.
Figure 2:
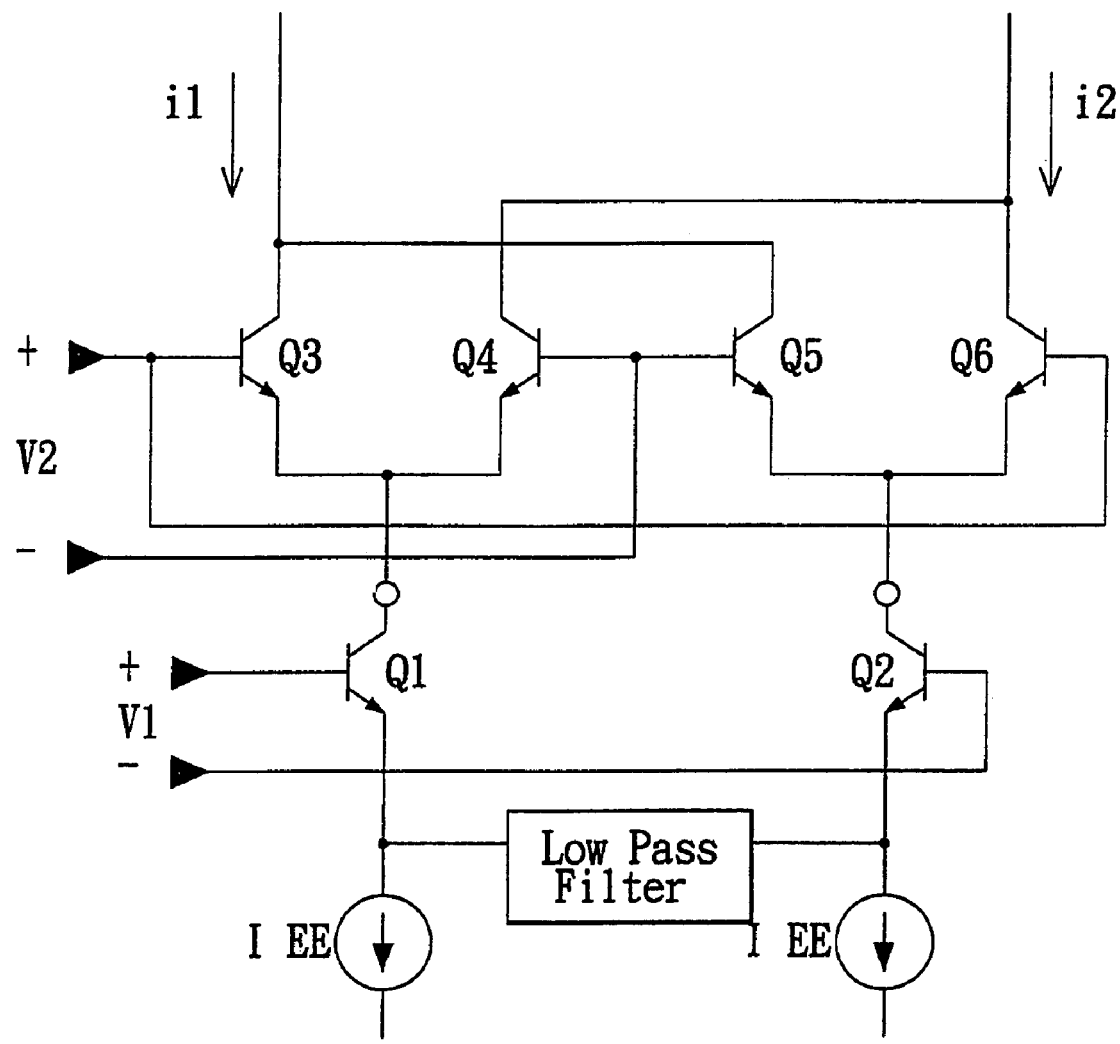
FIG. 2 is a schematic view illustrating a circuit of a conventional degenerate linear mixer.
Figure 3:
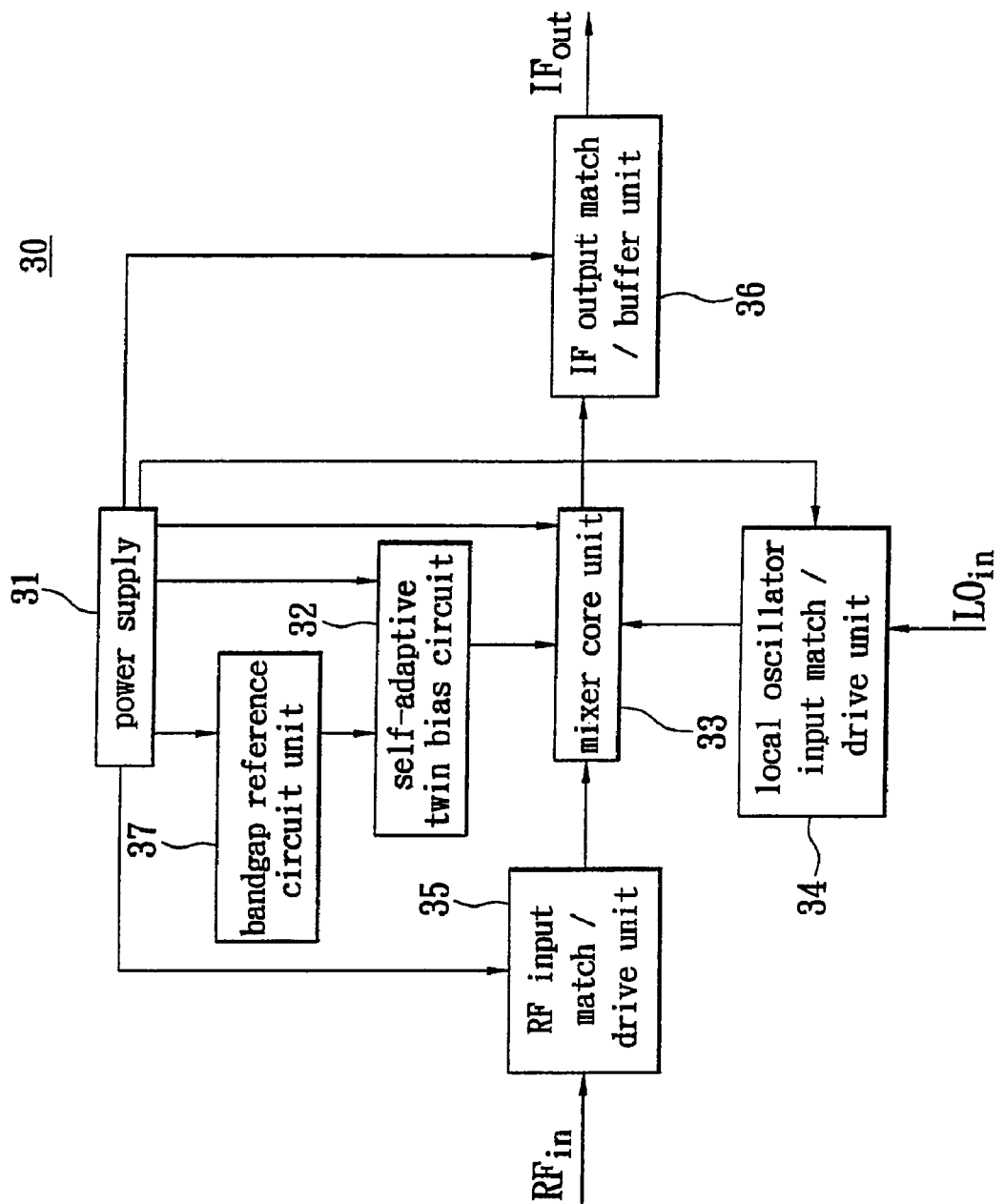
FIG. 3 is a schematic view illustrating function blocks of an active mixer with self-adaptive bias feedback according to this invention.

FIG. 3 is a schematic view illustrating function blocks of an active mixer with self-adaptive bias feedback according to this invention. A mixer 30 according to this invention is significantly improved compared to a conventional one in that a design and concept of dual self-feedback bias structure is used to provide a stable bias circuit with compensation effect. A suitable bias current is provided to an active circuit for prevention or decrease of signal distortion. Operational principles and skill features of this invention are described below in detail.

Referring now to FIG. 3, a power supply 31 supplies voltage required by an RF input match/drive unit 35, a local oscillator input match/drive unit 34, a mixer core unit 33, a self-adaptive twin bias circuit unit 32, and an IF output match/buffer unit 36. After receiving an RF input signal $RF_{in}$, the RF input match/drive unit 35 matches and drives the RF input signal $RF_{in}$, while after receiving a local oscillator input signal $LO_{in}$, the local oscillator input match/drive unit 34 matches and drives the local oscillator input signal $LO_{in}$. After receiving a signal output from the RF input match/drive unit 35 and the local oscillator input match/drive unit 34, the mixer core unit 33 processes signal mixing algorithm.

Next, the self-adaptive twin bias circuit unit 32 outputs to the mixer core unit 33 a constant bias for compensation. As a result, the IF output match/buffer unit 36 receives a signal from the mixer core unit 33 and outputs an IF output signal $IF_{OUT}$ after carrying out the signal match/buffering. The self-adaptive twin bias circuit unit 32 is made of two linear bias circuits connected in parallel. The mixer 30 according to this invention may further have a bandgap reference circuit 37, a voltage supply 31 offers voltage to the bandgap reference circuit 37. The bandgap reference circuit 37 outputs a constant voltage or current to the self-adaptive twin bias circuit unit 32. An embodiment of a linear bias in the self-adaptive twin bias circuit unit 32 is described below.

Figure 4:
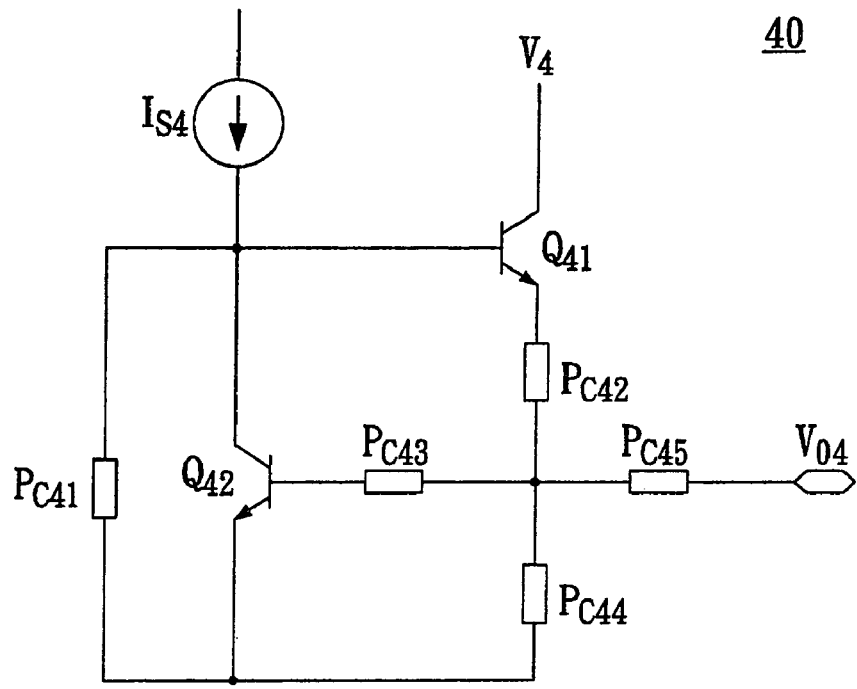
FIG. 4 is a first embodiment of a linear bias circuit according to this invention.

FIG. 4 is a first embodiment of a linear bias circuit according to this invention. The linear bias circuit 40 according to this invention comprises a direct voltage source $V_4$, a direct current source $I_{s4}$, a first NPN transistor $Q_{41}$, a second NPN transistor $Q_{42}$, a first passive component $P_{c41}$, a second passive component $P_{c42}$, a third passive component $P_{c43}$, a fourth passive component $P_{c44}$, and a fifth passive component $P_{c45}$.

A direct voltage source $V_4$ provides a direct voltage, while a direct current source $I_{s4}$ provides a direct current. First, the collector of the first NPN transistor $Q_{41}$ is electrically connected to a positive terminal of the direct voltage source $V_4$, while the base of the first NPN transistor $Q_{41}$ is electrically connected to a positive terminal of the direct current source $I_{s4}$. Then, the collector of the second NPN transistor $Q_{42}$ is electrically connected to the positive terminal of the direct current source $I_{s4}$. Next, a terminal of the first passive component $P_{c41}$ is electrically connected to the collector of the second NPN transistor, while the other terminal of the first passive component $P_{c41}$ is electrically connected to the emitter of the second NPN transistor $Q_{42}$. Further, the second passive component $P_{c42}$, the third passive component $P_{c43}$, the fourth passive component $P_{c44}$, and the fifth passive component $P_{c45}$, are electrically connected together through one of their terminals. The other terminal of the second passive component $P_{c42}$ is electrically connected to the emitter of the first NPN transistor $Q_{41}$, the other terminal of the third passive component $P_{c43}$ is electrically connected to the base of the second NPN transistor $Q_{42}$, the other terminal of fourth passive component $P_{c44}$ is electrically connected to the emitter of the second NPN transistor $Q_{42}$, and the other terminal of the fifth passive component $P_{c45}$ is electrically connected to a voltage output terminal $V_{O4}$. Finally, after the direct voltage source $V_4$ and the direct current source $I_{s4}$ supplies voltage and current, by means of voltage division from each component, a linear bias is output from the voltage output terminal $V_{O4}$.

Referring now to FIG. 4, each NPN transistor in a linear bias circuit 40 may be replaced with a PNP, NMOS, or PMOS transistor equivalent in performance. Then, each passive component in the linear bias circuit 40 may be a transistor, diode, resistor, inductive impedance, or capacitive impedance of proper size, type, ratio, or form.

Figure 5:
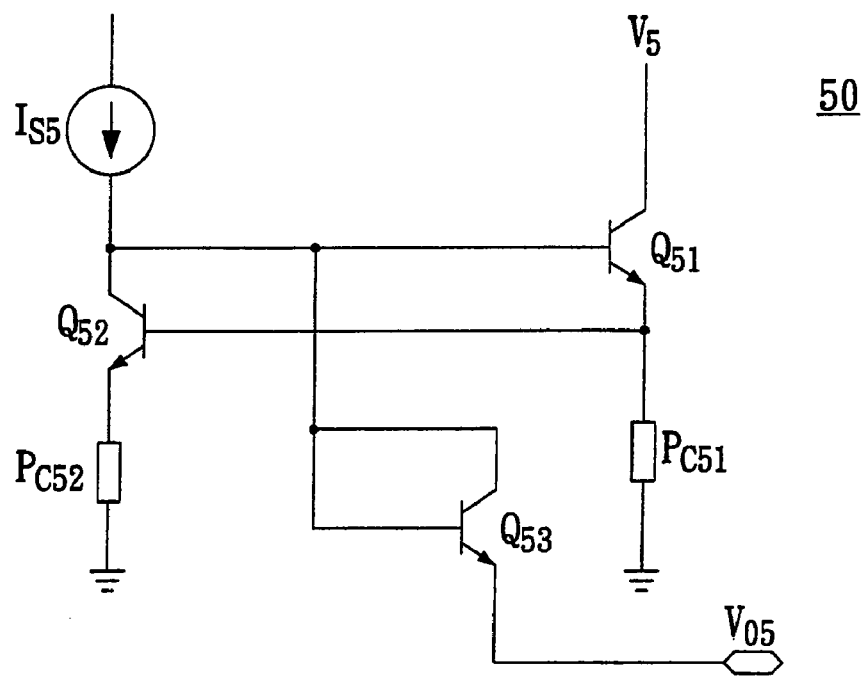
FIG. 5 is a second embodiment of the linear bias circuit according to this invention.

FIG. 5 is a second embodiment of a linear bias circuit according to this invention. The linear bias circuit 50 according to this invention comprises a direct voltage source $V_5$, a direct current source $I_{s5}$, a first NPN transistor $Q_{51}$, a second NPN transistor $Q_{52}$, a third NPN transistor $Q_{53}$, a first passive component $P_{c51}$, and a second passive component $P_{c52}$.

A direct voltage source $V_5$ supplies direct voltage, while a direct current source $I_{s5}$ supplies direct current. First, the collector of the first NPN transistor $Q_{51}$ is electrically connected to a positive terminal of the direct voltage source $V_5$, while the base of the first NPN transistor $Q_{51}$ is electrically connected to a positive terminal of the direct current source $I_{s5}$. Then, the collector of the second NPN transistor $Q_{52}$ is electrically connected to a positive terminal of the direct current source $I_{s5}$, while the base of the second NPN transistor $Q_{52}$ is electrically connected to the emitter of the first NPN transistor $Q_{51}$. Next, a terminal of the first passive component $P_{c51}$ is electrically connected to the emitter of the first NPN transistor $Q_{51}$, while the other terminal of the first passive component $P_{c51}$ is electrically grounded. Further, a terminal of the second passive component $P_{c52}$ is electrically connected to the emitter of the second NPN transistor $Q_{52}$, while the other terminal of the second passive component $P_{c52}$ is electrically grounded. Also, the collector and base of third NPN transistor $Q_{53}$ are electrically connected to the positive terminal of the direct current source $I_{s5}$, while the emitter of third NPN transistor $Q_{53}$ is electrically connected to a voltage output terminal $V_{O5}$. Finally, after the direct voltage source $V_5$ and the direct current source $I_{s5}$ respectively supply voltage and current, by means of voltage division from each component, a linear bias is output from the voltage output terminal $V_{O5}$.

Referring now to FIG. 5, each NPN transistor in a linear bias circuit 50 may be replaced with a PNP, NMOS, or PMOS transistor equivalent in performance. Then, each passive component in the linear bias circuit 50 may be a transistor, diode, resistor, inductive impedance, or capacitive impedance of proper size, type, ratio, or form.

Figure 6:
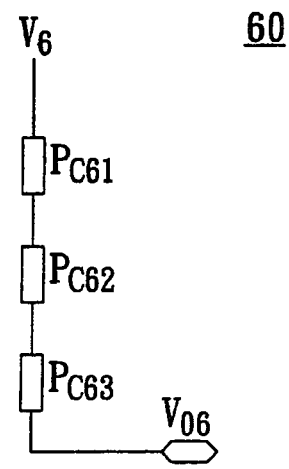
FIG. 6 is a third embodiment of the linear bias circuit according to this invention.

FIG. 6 is a third embodiment of the linear bias circuit according to this invention. The linear bias circuit 60 according to this invention comprises a direct voltage source $V_6$, a first passive component $P_{c61}$, a second passive component $P_{c62}$, and a third passive component $P_{c63}$.

The direct voltage source $V_6$ supplies direct voltage. First, a terminal of the first passive component $P_{c61}$ is electrically connected to a positive terminal of the direct voltage source $V_6$. Then, a terminal of the second passive component $P_{c62}$ is electrically connected to the other terminal of the first passive component $P_{c61}$. Next, a terminal of the third passive component $P_{c63}$ is electrically connected to the other terminal of the second passive component $P_{c62}$, while the other terminal of the third passive component $P_{c63}$ is electrically connected to a voltage output terminal. At last, after the direct voltage source $V_6$ supplies voltage and current, by means of voltage division from each component, a linear bias is output from the voltage output terminal $V_{O6}$.

Referring now to FIG. 6, each passive component in the linear bias circuit 60 may be a transistor, diode, resistor, inductive impedance, or capacitive impedance of proper size, type, ratio, or form.

Reference is made to FIGS. 3, 4, and 5. The mixer may be of all types. The self-adaptive twin bias circuit unit 32 is made of two linear bias circuits 40 and 50 connected in parallel. Alternatively, the self-adaptive twin bias circuit unit 32 is made of two linear bias circuits 40 and 60 connected in parallel. Alternatively, the self-adaptive twin bias circuit unit 32 is made of two linear bias circuits 50 and 60 connected in parallel.

Figure 7:
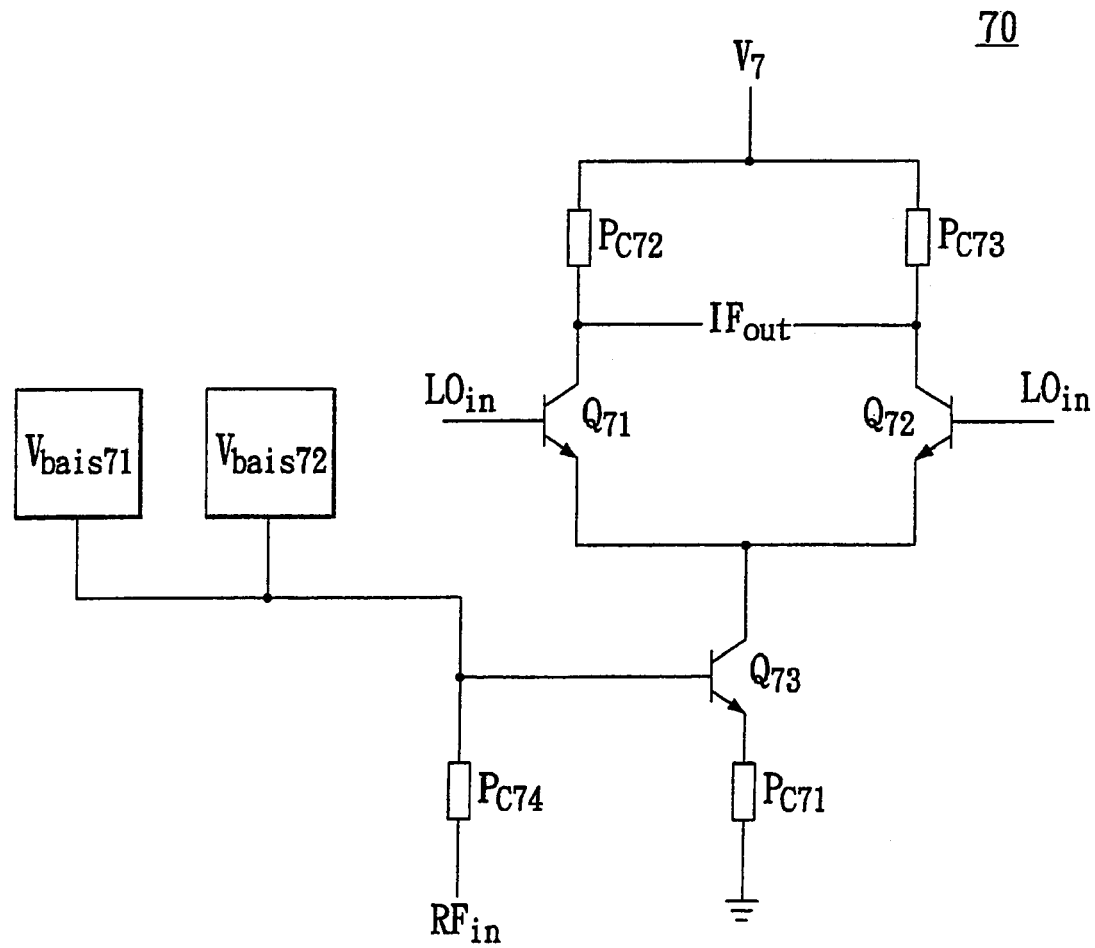
FIG. 7 is an embodiment of the active mixer according to this invention, a schematic view illustrating a circuit of a single balanced mixer with twin linear feedback bias circuits.

An embodiment of an active mixer with self-adaptive bias feedback is described below. Reference is made to FIG. 7, as well as FIGS. 3, 4, 5, and 6 for cross-reference. FIG. 7, a schematic view illustrating a circuit of a single balanced mixer with twin linear feedback bias circuits, shows an embodiment of the active mixer according to this invention. The self-adaptive twin bias circuit unit 32 comprises a first bias circuit $V_{bais71}$ and a second bias circuit $V_{bais72}$. The first bias circuit $V_{bais71}$ and the second bias circuit $V_{bais72}$ are made of two linear bias circuits 40 and 50 connected in parallel, two linear bias circuits 40 and 60 connected in parallel, or two linear bias circuits 50 and 60.

Figure 8:
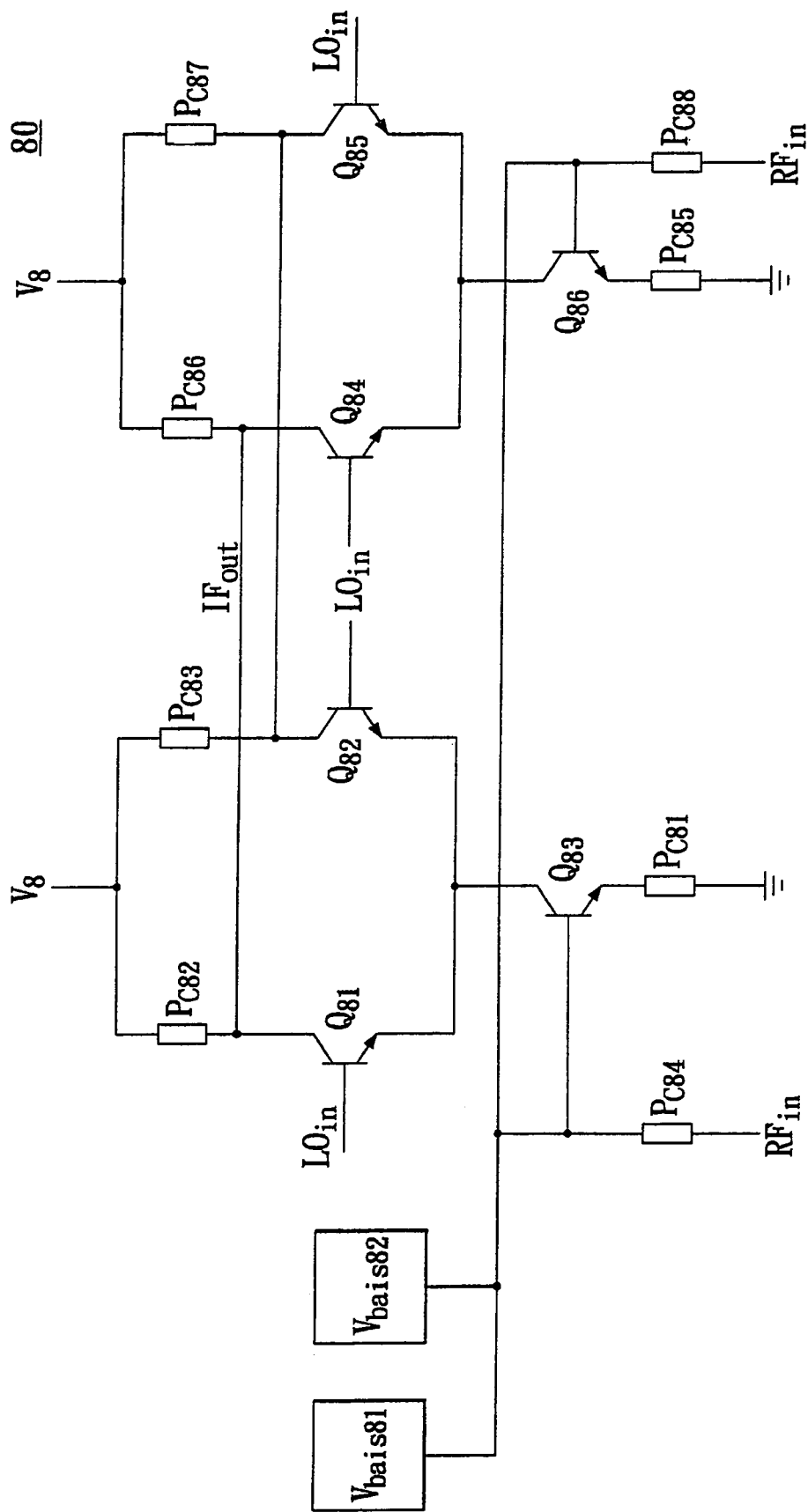
FIG. 8 is the other embodiment of the active mixer according to this invention, a schematic view illustrating a circuit of double balanced mixers with twin linear feedback bias circuits.

This invention may use various mixers. Reference is made to FIG. 8, as well as FIGS. 3, 4, 5, and 6 for cross-reference. FIG. 8, a schematic view illustrating a circuit of a double balanced mixer with twin linear feedback bias circuits, shows the other embodiment of the active mixer according to this invention. The self-adaptive twin bias circuit unit 32 comprises a first bias circuit $V_{bais81}$ and a second bias circuit $V_{bais82}$. The first bias circuit $V_{bais81}$ and the second bias circuit $V_{bais82}$ are also made of two linear bias circuits 40 and 50 connected in parallel, two linear bias circuits 40 and 60 connected in parallel, or two linear bias circuits 50 and 60.

The active mixer with self-adaptive bias feedback according to this invention provides a temperature compensation, improves the linearity and performance thereof, has a simple circuit structure, high integrated circuit, and less area, needs fewer components, does not increase current consumption, and does not change the original features thereof. The dual self-feedback bias structure may be further applied to various semiconductor manufacturing processes, components, and other microwave products, such as low noise amplifiers, oscillators, power amplifiers and the like.

However, in the description mentioned above, only the preferred embodiments according to this invention are provided without limit to claims of this invention; all those skilled in the art without exception should include the equivalent changes and modifications as falling within the true scope and spirit of the present invention.

What is claimed is:

1. An active mixer with self-adaptive bias feedback, comprising:
   a voltage supply supplying voltage required by the active mixer;
   an RF input match/drive unit receiving an RF input signal and matching/driving the RF input signal;
   a local oscillator input match/drive unit receiving a local oscillator input signal and matching and driving the local oscillator input signal;
   a mixer core unit receiving a signal output from the RF input match/drive unit and the local oscillator input match/drive unit, the mixer core unit dealing with a signal mixing algorithm;
   a self-adaptive twin bias circuit unit, the voltage supply supplying voltage to the self-adaptive twin bias circuit unit, the self-adaptive twin bias circuit unit outputting to the mixer core unit a constant bias with a compensation effect; and
   a IF output match/buffer unit receiving a signal from the mixer core unit and outputting an IF signal after carrying out the signal match/buffering;
   wherein the power supply supplies voltage required by the RF input match/drive unit, the local oscillator input match/drive unit, the mixer core unit, the self-adaptive twin bias circuit unit, and the IF output match/buffer unit;
   wherein the self-adaptive twin bias circuit unit is made of two linear bias circuits connected in parallel; and
   wherein after the voltage supply and the self-adaptive twin bias circuit unit supply the required voltage, the active mixer processes a mixing algorithm of the RF input signal and the local oscillator input signal and finally outputs the IF signal.

2. The active mixer with self-adaptive bias feedback according to claim 1, wherein a bandgap reference circuit is further added, the voltage supply offers voltage to the bandgap reference circuit, and the bandgap reference circuit outputs constant voltage or current to the self-adaptive twin bias circuit unit.

3. The active mixer with self-adaptive bias feedback according to claim 1, wherein one of the linear bias circuits of the self-adaptive twin bias circuit unit comprises:
   a direct voltage source supplying direct voltage;
   a direct current source supplying direct current;
   a first NPN transistor, wherein a collector thereof is electrically connected to a positive terminal of the direct voltage source and a base thereof is electrically connected to a positive terminal of the direct current source;
   a second NPN transistor, wherein a collector thereof is electrically connected to the positive terminal of the direct current source;
   a first passive component, wherein a terminal thereof is electrically connected to the collector of the second NPN transistor and another terminal is electrically connected to an emitter of the second NPN transistor; and
   a second passive component, a third passive component, a fourth passive component, and a fifth passive component electrically connected together through one terminal thereof, respectively, another terminal of the second passive component being electrically connected to an emitter of the first NPN transistor, another terminal of the third passive component being electrically connected to the base of the second NPN transistor, another terminal of the fourth passive component being electrically connected to the emitter of the second NPN transistor, and another terminal of the fifth passive component being electrically connected to a voltage output terminal;
   wherein after the direct voltage source and the direct current source respectively supply voltage and current, a linear bias is output from the voltage output terminal.

4. The active mixer with self-adaptive bias feedback according to claim 3, wherein each passive component in the linear bias circuit is a transistor, diode, resistor, inductive impedance, or capacitive impedance of proper size, type, ratio, or form.

5. The active mixer with self-adaptive bias feedback according to claim 1, wherein one of the linear bias circuits of the self-adaptive twin bias circuit unit comprises:
   a direct voltage source supplying direct voltage;
   a direct current source supplying direct current;
   a first NPN transistor, wherein a collector thereof is electrically connected to a positive terminal of the direct voltage source and a base thereof is electrically connected to a positive terminal of the direct current source;
   a second NPN transistor, wherein a collector thereof is electrically connected to a positive terminal of the direct current source and a base thereof is electrically connected to an emitter of the first NPN transistor;
   a first passive component, wherein a terminal thereof is electrically connected to the emitter of the first NPN transistor and another terminal thereof is electrically grounded;
   a second passive component, wherein a terminal is electrically connected to an emitter of the second NPN transistor and another terminal thereof is electrically grounded; and a third NPN transistor, wherein a collector and a base thereof are electrically connected to the positive terminal of the direct current source and a emitter thereof is electrically connected to a voltage output terminal;

wherein after the direct voltage source and the direct current source respectively supply voltage and current, a linear bias is output from the voltage output terminal.

6. The active mixer with self-adaptive bias feedback according to claim 5, wherein each passive component in the linear bias circuit is a transistor, diode, resistor, inductive impedance, or capacitive impedance of proper size, type, ratio, or form.

7. The active mixer with self-adaptive bias feedback according to claim 1, wherein one of the linear bias circuits of the self-adaptive twin bias circuit unit comprises:
a direct voltage source supplying direct voltage;
a first passive component, wherein a terminal thereof is electrically connected to a positive terminal of the direct voltage source;
a second passive component, wherein a terminal thereof is electrically connected to another terminal of the first passive component; and
a third passive component, wherein a terminal thereof is electrically connected to another terminal of the second passive component and another terminal thereof is electrically connected to a voltage output terminal;
wherein after the direct voltage source supplies voltage, a linear bias is output from the voltage output terminal.

8. The active mixer with self-adaptive bias feedback according to claim 7, wherein each passive component in the linear bias circuit is a transistor, diode, resistor, inductive impedance, or capacitive impedance of proper size, type, ratio, or form.

9. The active mixer with self-adaptive bias feedback according to claim 1, wherein the self-adaptive twin bias circuit unit is made of linear bias circuits according to claim 3 and claim 5, and the linear bias circuits are connected in parallel.

10. The active mixer with self-adaptive bias feedback according to claim 1, wherein the self-adaptive twin bias circuit unit is made of linear bias circuits according to claim 3 and claim 7, and the linear bias circuits are connected in parallel.

11. The active mixer with self-adaptive bias feedback according to claim 1, wherein the self-adaptive twin bias circuit unit is made of linear bias circuits according to claim 5 and claim 7, and the linear bias circuits are connected in parallel.

12. A linear bias circuit, comprising:
a direct voltage source supplying direct voltage;
a direct current source supplying direct current;
a first NPN transistor, wherein a collector thereof is electrically connected to a positive terminal of the direct voltage source and a base thereof is electrically connected to a positive terminal of the direct current source;
a second NPN transistor, wherein a collector thereof is electrically connected to the positive terminal of the direct current source;
a first passive component, wherein a terminal thereof is electrically connected to the collector of the second NPN transistor and another terminal is electrically connected to an emitter of the second NPN transistor; and
a second passive component, a third passive component, a fourth passive component, and a fifth passive component electrically connected together through one terminals thereof, respectively, another terminal of the second passive component being electrically connected to the emitter of the first NPN transistor, another terminal of the third passive component being electrically connected to a base of the second NPN transistor, another terminal of the fourth passive component being electrically connected to an emitter of the second NPN transistor, and another terminal of the fifth passive component being electrically connected to a voltage output terminal;

wherein after the direct voltage source and the direct current source respectively supply voltage and current, a linear bias is output from the voltage output terminal.

13. The linear bias circuit according to claim 12, wherein each passive component is a transistor, diode, resistor, inductive impedance, or capacitive impedance of proper size, type, ratio, or form.

14. A linear bias circuit, comprising:
a direct voltage source supplying direct voltage;
a direct current source supplying direct current;
a first NPN transistor, wherein a collector thereof is electrically connected to a positive terminal of the direct voltage source and a base thereof is electrically connected to a positive terminal of the direct current source;
a second NPN transistor, wherein a collector thereof is electrically connected to a positive terminal of the direct current source and a base thereof is electrically connected to an emitter of the first NPN transistor;
a first passive component, wherein a terminal is electrically connected to the emitter of the first NPN transistor and another terminal is electrically grounded;
a second passive component, wherein a terminal thereof is electrically connected to an emitter of the second NPN transistor and another terminal is electrically grounded; and
a third NPN transistor, wherein a collector and a base thereof are electrically connected to the positive terminal of the direct current source and the emitter is electrically connected to a voltage output terminal;
wherein after the direct voltage source and the direct current source respectively supply voltage and current, a linear bias is output from the voltage output terminal.

15. The linear bias circuit according to claim 14, wherein each passive component is a transistor, diode, resistor, inductive impedance, or capacitive impedance of proper size, type, ratio, or form.

16. A linear bias circuit, comprising:
a direct voltage source supplying direct voltage;
a first passive component, wherein a terminal thereof is electrically connected to a positive terminal of the direct voltage source;
a second passive component, wherein a terminal thereof is electrically connected to another terminal of the first passive component; and
a third passive component, wherein a terminal thereof is electrically connected to another terminal of the second passive component and another terminal thereof is electrically connected to a voltage output terminal;
wherein after the direct voltage source supplies voltage, a linear bias is output from the voltage output terminal.

17. The linear bias circuit according to claim 16, wherein each passive component is a transistor, diode, resistor, inductive impedance, or capacitive impedance of proper size, type, ratio, or form.

* * * * *